(12) United States Patent
Ugur

(10) Patent No.: US 11,782,078 B2
(45) Date of Patent: Oct. 10, 2023

(54) METHOD AND APPARATUS FOR PULSED POWER MEASUREMENT

(71) Applicant: ASELSAN ELEKTRONIK SANAYI VE TICARET ANONIM SIRKETI, Ankara (TR)

(72) Inventor: Ismail Ugur, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 371 days.

(21) Appl. No.: 17/312,430

(22) PCT Filed: Dec. 25, 2018

(86) PCT No.: PCT/TR2018/050886
§ 371 (c)(1),
(2) Date: Jun. 10, 2021

(87) PCT Pub. No.: WO2020/139207
PCT Pub. Date: Jul. 2, 2020

(65) Prior Publication Data
US 2022/0018883 A1      Jan. 20, 2022

(51) Int. Cl.
*G01R 21/133*        (2006.01)
*G01J 11/00*         (2006.01)
*H03F 3/21*          (2006.01)

(52) U.S. Cl.
CPC ............ *G01R 21/133* (2013.01); *G01J 11/00* (2013.01); *H03F 3/21* (2013.01); *H03F 2200/451* (2013.01)

(58) Field of Classification Search
CPC .......... G01R 21/133; G01J 11/00; H03F 3/21; H03F 2200/451; H04B 10/07955
See application file for complete search history.

(56) References Cited

U.S. PATENT DOCUMENTS 5,491,548 A * 2/1996 Bell ................... G01M 11/3145
356/73.1

* cited by examiner

*Primary Examiner* — Farhana A Hoque
(74) *Attorney, Agent, or Firm* — Bayramoglu Law Offices LLC

(57) ABSTRACT

A measurement method and apparatus for determining power levels of pulsed power signals, wherein the pulsed power signals are needed for some applications with a high dynamic range and a high speed simultaneously. The apparatus and the measurement method particularly used to evaluate a performance of fiber optic sensors, optical pulse generators, switching devices and debugging other pulsed power systems.

7 Claims, 2 Drawing Sheets

METHOD AND APPARATUS FOR PULSED POWER MEASUREMENT

CROSS REFERENCE TO THE RELATED APPLICATIONS

This application is the national stage entry of International Application No. PCT/TR2018/050886, filed on Dec. 25, 2018, the entire contents of which are incorporated herein by reference.

TECHNICAL FIELD

The present disclosure relates to a measurement method and apparatus allow to determining power levels of pulsed sources in conduction and cut off states, with high dynamic range and high speed, needed in some optical communication and sensor applications. The mentioned method and apparatus particularly can be used to evaluate the performance of fiber optic sensor signal fidelity, switching devices and other pulse generating systems.

BACKGROUND

Known commercial optical power meters are not sufficient for measuring high speed short time optical pulses because of their long measurement times (typically hundreds of microseconds to milliseconds) which arise from low noise measurement requirement. When the power of high speed pulses tried to be measured with wideband/high speed photodiodes, dynamic range is substantially reduced because of the high noise floor which is proportionally increasing with measurement bandwidth. Measurement of the pulsed signals in the order of nanoseconds with high dynamic range is critical to determine the performance of switching devices and systems in some optical applications.

In prior art, high dynamic range measurement is proposed based on switching gain amplifiers, logarithmic amplifiers and using different sensitivity optical receivers selectively inserted into low and high power signal channels.

As an example, one of the most comprehensive patent numbered U.S. Pat. No. 5,491,548 a wide dynamic range optical receiver has two channel for different power level signals is mentioned. The optical signal to be measured is branched into two arms, then feed to two different sensitivity channels. Low noise and high power measurement is carried out by means of two different amplifier gain/attenuation or two different sensitivity photodiodes.

In another patent, document no. US2002/0097392 A1, for high dynamic range measurement, range selection circuit and logarithmic amplifier is proposed. This is a typical method in prior art to extend measurement dynamic range.

Distinctively, this invention is specifically targeting pulsed power measurement in high dynamic range and speed, employing different methods. Firstly, signal to be measured is chopped in time domain such that high power portion of pulsed signal never transmitted to high sensitivity receiver, enabling optimization of related receiver for very low level and low dynamic range signals. Secondly low noise measurement is extended not only by detector sensitivity but also utilizing long cut-off duration of low duty cycle signals which is typical in long range fiber optic cable sensors.

In known application, commercial power meters can measure at the lowest noise level need minimum 100 microseconds for measurement and they are fair enough for measuring continuous wave signals. However, an optical signal in the order of 100 nanoseconds and has 2 KHz pulse repetition rate which is typical for long range fiber optic sensor applications, cannot be measured with high dynamic range while the system is running, namely system is firing pulses repetitively.

Power measurement of high speed/high dynamic range pulsed signals is possible with using off the shelf components in high dynamic range even while the system is running via the present disclosure. Besides that, detailed pulse power profile may be constructed thereby pulsed signal is sampled in different instants for each pulse repetition period.

SUMMARY

The invention aims to determining power levels of high speed and high dynamic range pulsed sources in conduction and cut-off states.

A measurement apparatus, allow to determining power levels of pulsed signals in conduction and cut-off states with high dynamic range and high speed and mentioned apparatus characterized by comprising;
- at least one pulsed power signal generator which generates pulses with a synchronous trigger signal, which may be comprising; at least one continuous signal source, at least one power amplifier, at least one amplitude modulator-I with trigger signal interface.
- at least one power divider unit, alternately coupler connected to mentioned modulator-I's output and divides signals came from the modulator-I to parts as a low power part and a high power part,
- at least one wideband receiver-I connected with the low power output of mentioned power divider unit and measures the high power/high speed portion (conduction state power) of the pulsed power signal,
- at least one low pass filter-I which is connected with mentioned receiver-I for band limiting and anti-aliasing,
- at least one analog-digital converter-I for digitizing signals which is taken from mentioned low pass filter-I,
- at least one modulator-II connected to the power divider unit's high power output and prevents to be including high power portion (conduction state power) of the signals in power measurement by the way of entering into the cut-off mode when mentioned modulator-I is in conduction mode and entering into the conduction mode when mentioned modulator-I is in cut-off mode, entering into the conduction state only for narrow sampling window instead of being in conduction during whole cut off state of modulator-I when data processing and monitoring unit in pulse profile mode,
- at least one low noise receiver-II connected with mentioned modulator-II and measures the low power portion (cut-off state power) of the pulsed signals,
- at least one low pass filter-II which is connected with mentioned receiver-II for band limiting and anti-aliasing,
- at least one analog-digital converter-II for digitizing signals which is taken from mentioned low pass filter-II,
- at least one data processing and monitoring unit forms a pulse profile thereby processing and respectively combining signals which is digitally came from mentioned analog digital converter-I and analog digital converter-II and displays in numerical and graphical form,
- at least one driver-I amplifies pulses needed to by the modulator-I, beside this, synthesizes a RF carrier if the modulator-I is like AOM (Acuosto optic modulator), at least one driver-II generates pulses needed to by the modulator-II, beside this, synthesizes a RF carrier if the modulator-II is like AOM (Acuosto optic modulator), at least one timing unit connected with mentioned driver-I and driver-II for controlling mentioned modulator-I and modulator-II as making modulator-II entering into the cut-off mode when mentioned modulator-I is in conduction mode and making modulator-II entering into the conduction mode when mentioned modulator-I is in cut-off mode, and work synchronously with mentioned analog digital converter-I, analog digital converter-II and data processing and monitoring unit.

Alternately, if data processing and monitoring unit is capable of generating driving pulses for driver-I and driver-II, timing unit may not be needed.

Also, a measurement method, allow to determining power levels signals in conduction and cut-off states with high dynamic range and high speed and mentioned method characterized by comprising steps of;

- a pulsed power signal generator with synchronous trigger signal to be measured, which may be comprising; at least one continuous signal source, at least one power amplifier, at least one modulator with trigger signal interface.
- branching signal to be measured as two paths, division ratio is determined according to power limits of measuring receiver-I and receiver-II,
- preventing high power portion (conduction state power) of the signal effect on the measurement of cut off power thereby blocking the conduction of high power portion with a modulator-II during pulse width duration, which is controlled by a timing unit synchronously,
- getting higher resolution in cut off state and to create pulse profile due to modulator-II goes conduction state only for narrow sampling window instead of being in conduction during whole cut off state of modulator-I,
- to reduce minimum measurable leakage power by the way of measurement can be carried out on the same measurement window (14) over multiple periods thereby modulator-II goes on during relevant time window then back to off state,
- measuring of high power portion (conduction state power) of signal with an receiver-I,
- filtering receiver-I's output signals with a low pass filter for band filtering and anti-aliasing,
- digitizing filtered signals with an analog-digital converter-I with proper sampling rate,
- power measuring of low power portion (cut off state power) of signal with an receiver-II,
- filtering receiver-If s output signals with a low pass filter-II for band limiting and anti-aliasing, (Lower cut off frequency of low pass filter enable lower level power measurement in the expense of measurement speed. Because of cut off state duration is much longer than conduction state duration, lower cut off frequency thus longer integration time is possible.)
- digitizing filtered signals with an analog-digital converter-II with proper sampling rate,
- to take into digitized and filtered signals came from analog-digital converter-I and converter-II, and obtained numerical Pmax and Pmin values and graphical pulse profile displayed by a data processing and monitoring unit.

PART REFERENCES

1. Signal Source
2. Power Amplifier
3. Modulator-I
123. Pulse Generating Part
4. Driver-I
5. Power Divider Unit
6. Timing Unit
7. Driver-II
8. Modulator-II
9.*a*. Receiver-I
9.*b*. Receiver-II
10.*a*. Low-Pass Filter-I
10.*b*. Low-Pass Filter-II
11.*a*. Analog-Digital Converter-I
11.*a*. Analog-Digital Converter-II
12. Data Processing and Monitoring Unit
13. Pulse Form
14. Measurement Window
15. Spurious Signal
16. Blind region
17. Trigger signal for Conduction
18. Trigger signal for Cut-off

DETAILED DESCRIPTION OF THE EMBODIMENTS

Figure 1:
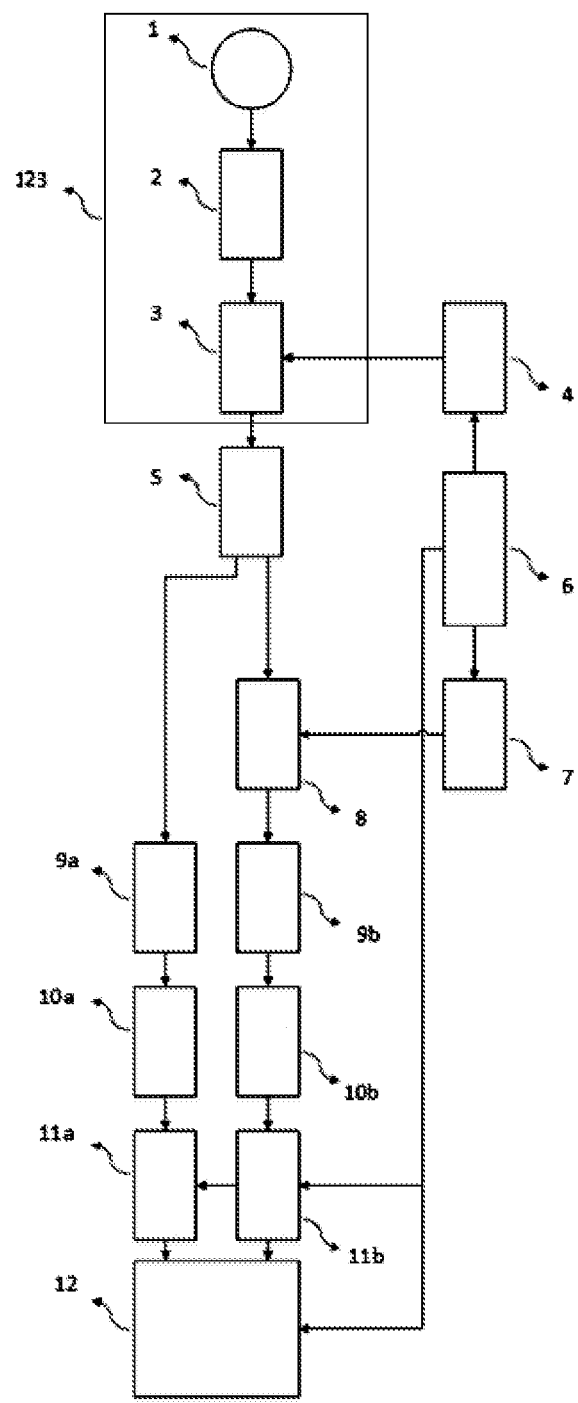
FIG. 1 illustrates the apparatus of pulsed power measurement setup with high dynamic range and high speed.

The invention is a method and apparatus for measurement of pulsed power signals and plotting constituted of power profile for signals. FIG. 1 is system architecture for pulsed power measurement with high dynamic range and high speed.

A measurement apparatus, allow to determining power levels of pulse signals in conduction and cut-off states with high dynamic range and high speed and mentioned apparatus characterized by; a pulse generating part (123) synchronous with a trigger signal, which may be comprising at least one signal source (1) which generates signals, at least one power amplifier (2) amplifies signal generated in mentioned signal source (1), at least one amplitude modulator-I (3) to generate pulses from mentioned continuous signals, at least one power divider unit (5) connected to mentioned modulator-I's (3) output and divides signals came from the modulator-I (3) to parts as a low power part and a high power part, at least one driver unit (4) to drive mentioned modulator-I (3), at least one receiver-I (9.*a*) connected with the low power output of mentioned power divider unit (5) and measures the high power portion (conduction state power) of the pulsed signal, at least one low pass filter-I (10.*a*) which is connected with mentioned receiver-I (9.*a*), at least one analog-digital converter-I (11.*a*) for digitizing signals which is taken from mentioned low pass filter-I (10.*a*), at least one modulator-II (8) connected to the power divided unit's (5) high power output and prevents high power portion of the pulsed signal to reach high sensitivity receiver-II by the way of entering into the cut-off mode when mentioned modulator-I (3) is in conduction mode and entering into the conduction mode when mentioned modulator-I (3) is in cut-off mode, at least one receiver-II (9.*b*) connected with mentioned modulator-II (8) and measures the low power portion (cut off state power) of pulsed signal, at least one low pass filter-II (10.*b*) which is connected with mentioned receiver-II (9.*b*), at least one analog-digital converter-II (11.*b*) for digitizing signals which is taken from mentioned low pass filter-II (10.*b*), at least one data processing and monitoring unit (12) forms a pulse profile thereby processing and respectively combining signals which is digitally came from mentioned analog digital converter-I (11.*a*) and analog digital converter-II (11.*b*), at least one driver-I (4) amplify pulses needed to by the modulator-I (3), at least one driver-II (7) amplify pulses needed to by the modulator-II (8), at least one timing unit (6) connected with mentioned driver-I (4) and driver-II (7) for controlling mentioned modulator-I (3) and modulator-II (8) as making modulator-II enter into cut-off mode (8) when mentioned modulator-I (3) is in conduction mode and making modulator-II entering into the conduction mode-I (8) when mentioned modulator-I (3) is in cut-off mode, providing to run in synchronism.

The invention is an apparatus as described above and a method can be run on this system, preferably can be disclosure with an optical system. In this preferred embodiment a laser signal source, an optical power amplifier, modulators, coupler and optical receivers are used instead of respectively signal source (1), power amplifier (2), modulators (3, 8), power divider (5) and receivers (9.*a*, 9.*b*).

The optical signal generated in a laser signal source is amplified by an optical power amplifier (2). Obtained high power continuous wave optical signal is transmitted to the modulator-I (3) after, amplitude modulation is applied. Depending on the conduction/cut-off durations of the modulation, a pulse signal is generated in the desired form. The high power and fast driving pulses required by the modulator-I (3) are supplied by the driver-I (4) unit. The pulse width, period and the starting time are determined by the timing unit (6). Generated pulse signal is branched two signals with different power levels by means of the coupler. The optical signal are going to be processed as two signal like high power and low power part anymore. The low power part of the optical signal is transmitted to the data processing and monitoring unit (12) as digitized thereby processing via the optical receiver-I (9.*a*), low-pass filter-I and analog-digital converter-I (11.*a*) while, the high power part of the optical signal is transmitted to the data processing and monitoring unit (12) as digitized thereby processing via modulator-II (8), optical receiver-II (9.*b*), low-pass filter-II (10.*b*) and analog-digital converter-II (11.*b*). The high power and fast driving pulses required by the modulator-II (8) are supplied by the driver-II (7) unit. The pulse width, period and the starting time are determined again by the timing unit (6).

The main challenge about pulsed power measurement is high dynamic range of two different power levels (Ppeak, Pmin) while, the measured pulse width is narrow in the order of nanoseconds. The power measurement should be made for each pulse period, meanly high speed and high dynamic range requirement must be met at the same time. On the other hand, there is an inverse relationship between the measurable minimum power and bandwidth (required measurement BW proportional to the pulse rising time). In other words, it is possible to measure faster signals only by increasing the bandwidth, thus increasing the minimum measurable power and narrowing dynamic range. The parameter that expresses the noise power of the photodiode is NEP (Noise Equivalent Power) and the measuring bandwidth is BW;

$$P\text{min} = NEP \cdot \sqrt{BW} \qquad \text{(Equation 1)}$$

is the equation of the Pmin.

As can be seen in the equation 1, the minimum power level that can be measured increases in proportion to the square root of the measurement bandwidth. This also means that, the dynamic range of the detector is reduced. The bandwidth required to measure the optical pulse power is inversely proportional to the rising time of the pulse. BW is bandwidth and $t_r$ is pulse rising time;

$$BW = \frac{0.35}{t_r} \qquad \text{(Equation 2)}$$

is the equation relationship of them.

When these two equation 1 and 2 are considered, it is not possible to measure a high speed and high dynamic range optic signal simultaneously with a single photodiode or receiver. When commercially available off the shell power meter products are currently examined, it is seen that the highest performance power meters typically measure in the range of −110 dBm to +10 dBm at 1550 nm requires 100 microseconds integration time. While the dynamic range of this power meter reaches 120 dB, the integration time required for the measurement to be 100 microseconds evidences that it cannot measure fast pulses with a rising time and width in the level of nanoseconds. In the present disclosure, two separate receivers are used for high-speed and low-noise measurement to eliminate this constraint. One of these receivers measures the high speed/high power pulse portion (conduction state power) of the optical signal, while the other receiver measures the low power/long duration part of the optical signal. The receivers (9.*a*, 9.*b*) are differ in bandwidth or integration time and power levels they are optimized to measure as well. Using different level of integration time and sensitivity receivers is possible because of the nature of the low duty cycle pulse signal which has off duration much longer than on duration and conduction state power is much higher than the cut off state power. For example, while the width of the measured optical pulse is in the order of 100 nanoseconds, the time of the relaxing (cut off) after the pulse may be in the order of 500 microseconds. The signal's duty cycle (100 ns/500 us=0.0002) is very small, so longer integration time is possible in the cut off state power measurement phase thus, the lower noise measurement can be achieved.

The related terms used in the document, optical receiver, photodiode and power meters are the devices used to convert optical power to electrical signal in general sense. But there is some differences such as; photodetector is bare form of optical to electrical signal conversion, optical receiver is one with additional circuitry like transimpedance amplification of photodiode output current and some additional filtering and biasing. Power meter is a device directly converting optical signal to power reading. The low-pass filters (10*a*, 10*b*) is used for band limiting and anti-aliasing purposes.

Figure 3:
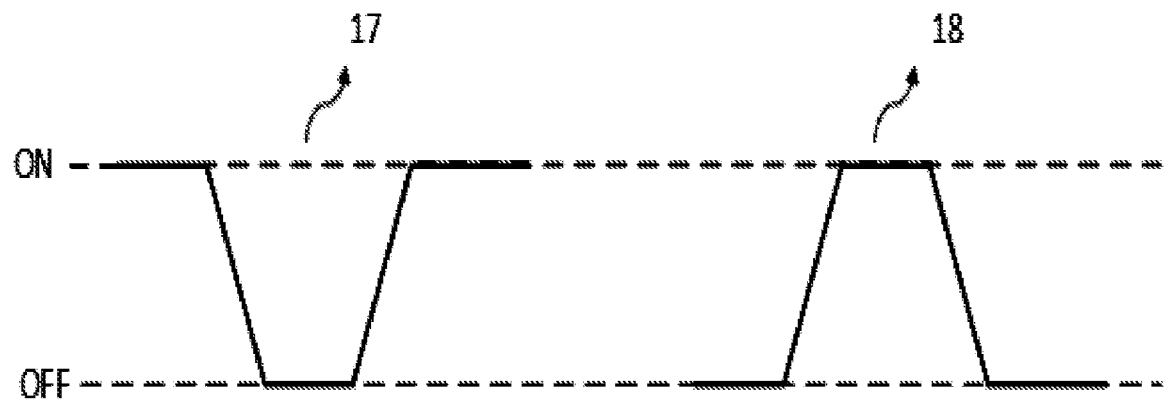
FIG. 3 is the diagram of trigger signals for modulator operating states. (Conduction and cut-off)

If we continue to explain from the optical application example, in the system architecture shown in FIG. 1, the power distribution at the outputs of the coupler is branched into as high-power and low-power parts asymmetrically. The low power output part is transmitted directly to the optical receiver-I (9.*a*) and the minimally attenuated high power output part to the modulator-II (8). In FIG. 3, envelope of the trigger signals that drive modulator-II (8) into on/off states is shown. The trigger signal of modulators (3, 8) for conduction state (17) and the trigger signal of modulators for cut-off state (18) are binary level signal. Depending on the type of modulator, the trigger signal may contain high frequency RF carrier. The conduction/cut off states generated by the modulator-II (8) is in synchronization with conduction/cut off states of the modulator-I (3) which responsible for generating pulsed signal. The scope of this synchronization is to operate the two modulators (3, 8) at the same frequency and to compensate for the delays along the signal path appropriately. The timing unit (6) manage this function. When the modulator-I (3) is engaged the conduction state to generate a high power optical pulse, the modulator-II (8) is driven in cut-off state at least as long as pulse width. The reason of why the modulator-II (8) is driven into the cut-off states in when the modulator-I (3) is in conduction state is to prevent transmitting of the conduction state power of pulse generating part (123) to the high sensitivity optical receiver-II (9.*b*) and the result of measurement thus, allowing only the measurement of low leakage power (Pmin). In other words, the high power portion of the measured pulse is isolated electronically thus, the measurement of the leakage power (Pmin) can be performed with low power/high sensitivity optical receiver-I (9.*a*) and in longer integration time (T>>τ). The minimum power value or the leakage power with other mention (Pmin) can be measured with sufficient accuracy depending on the on/off isolation level of the modulator-II (8). If the modulator-II (8) does not suppress the peak power (Ppeak) enough, the leaked power during τ came from high power part will affect the measurement of the leakage power (Pmin). For example, if the Ppeak/Pmin ratio of the optical signal to be measured is 120 dB, the isolation required by the modulator-II (8) should be greater than 120 dB. As the isolation level increases, the error of measuring the Pmin value is reduced. In the case of using acousto-optic modulator (AOM) as modulator-II (8), when the commercial products are examined, the typical value of the isolation level that can be achieved with a single device is 60 dB. These modules can be connected in series to achieve isolation values of 120 dB and higher.

Cut-off time for the modulator-II (8) is τ, and the conduction time for the modulator-II (8) can be supposed as the measurement time window (14) at least and up to (T−τ). In order to measure the low power, it is necessary to use receivers (9.*a*, 9.*b*) with low NEP rated photodiodes and long integration time. For example, if the pulse width is 100 nanosecond and the pulse repetition period is 1 millisecond, the signal is at 0.01% peak power (Ppeak) and 99.99% at leakage power (Pmin) values. The time available for measuring the leakage power (Pmin) of the signal (0.999 ms) is much longer compared to the pulse time (100 ns). Using the advantage of this long time, the minimum power value (Pmin) that the optical receiver-II (9.*b*) can measure is reduced. Using off the shell power meter, −110 dBm power measurement is possible with 100 microsecond integration time. When measuring the leakage power (Pmin), the cut-off period can be used completely after the pulse also, a narrower measurement window (14) can be used. A narrow measurement window (14) can be used to observe how the leakage power (Pmin) changes over multiple pulse repetition period at a specific time instant. T is the pulse period, τ is the pulse width, and $\tau_m$ is the measurement window (14) duration, $$N = \frac{T-\tau}{\tau_m}$$ (Equation 3)

where N is the number of samples can be acquired separately, thus measurement time resolution of minimum power (Pmin). In case of measuring Pmin in a specific time instant over multiple periods with a power meter gives average value of the Pmin. Real value of Pmin;

$$P_{min} = P_{ave} \times \frac{T}{\tau_m}$$ (Equation 4)

can be used. If the photodiode or optical receiver (9.*a*, 9.*b*) is used instead of power meter, direct value of Pmin can be read but in the expense of higher measurable minimum power. Commercial power meter has much narrow bandwidth enabling lower signal measurement and outputs average power. The measured points are digitized with the analog-to-digital converter-II (11.*b*) to create a pulse profile of leakage power and can be displayed to the user graphically as in FIG. 2.

Increasing the measurement window (14) ($\tau_m$) will reduce time resolution of measurement but giving more integration time thus enabling lower power measurement in return. Therefore time resolution can be traded off against dynamic range of the measurement. By using the periodicity of the optical signal, the integration time in the relevant measurement window (14) can be extended by employing repetitive sampling at the same time instant which enables lower level power measurement.

While the leakage power (Pmin) is measured as above the high power portion of the signal (conduction state power) is directly measured via the optical receiver-I (9.*a*). The optical receiver-I (9.*a*) is selected as high-speed/wideband, in particular for measurement during the pulse time (τ) and should withstands pulse peak power. Analog-digital converter-I (11.*a*) samples at the output of the optical receiver-I (9.*a*) gives direct pulse profile of high power portion of the signal. After acquisition of samples from two branches, the whole data is transferred to data processing and monitoring unit (12) where data samples are combined in time respectively so that complete pulse profile is formed Power division ratio of the coupler is selected taking into account, the peak power value (Ppeak) of the pulse and the power limits of the optical receivers used for measurement. For example, if the peak power (Ppeak) of the optical pulse is +30 dBm and the maximum power that the optical receiver-I (9.*a*) which is connected with the low power path can with stand is +10 dBm, the coupler (5) must provide 20 dB power attenuation at least in related arm. Assuming that the maximum input power level at which optical receiver-I (9.*a*) works linearly is +10 dBm, the minimum measurable input power of optical receiver-II (9.*b*) is −110 dBm@100 us, if input pulse with peak power of +30 dBm to be measured, 140 dB (+30 dBm−(−110 dBm)) dynamic range can be achieved with this invention. The pulses with a higher peak value can be measured by increasing power division ratio of the coupler. On the other hand, the coupler and the modulator-II (8) must be capable of withstanding high input power levels (>+30 dBm). Depending on the noise floor of the high speed optical receiver-I (9.*a*), there is a blind region (16) where power measurement cannot be done. Also, high sensitivity, low bandwidth optical receiver-II (9.*b*), is useless because of either fast edge of the mentioned blind region (16) or high power level that is above the power limit of sensitive optical receiver-II (9.*b*). Mentioned blind region (16) may be interpolated approximately from known data points around it.

Figure 2:
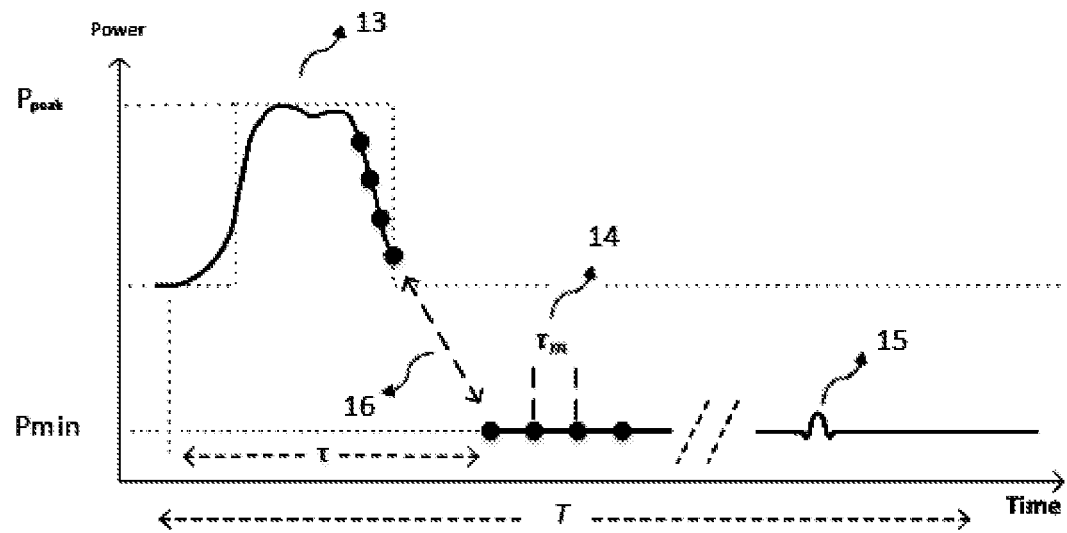
FIG. 2 shows the input signal to be measured power-time plot.

Fiber optic distributed sensor systems are able to detect vibration, strain, temperature and their position along the fiber optic cable by interrogating the cable with optical pulses in kilometers range. As an example, mentioned pulses can be generated by means of the laser signal source (1), the optic power amplifier (2), the modulator-I (3) those are elements of the pulse generating part (123), the driver-I (4) and the timing unit (6) of the system shown in FIG. 1. The stability of generated pulses in terms of width, amplitude and period is critical to the system performance of the fiber optic sensor. These parameters has direct effects on the noise level of the fiber optic sensor. Therefore, the accurate power measurement and profiling of the optical pulse that fiber optic sensor sent to the fiber cable is extremely important for evaluating and improving system performance. The pulse form (13) which is expected to be rectangular in the ideal case, may take a different shape as seen in FIG. 2 in consequence of some effects inflicted from the laser signal source (1), the optical power amplifier (2), the modulator-I (4) and the driver-I (4). Also, some additional spurious signals (15) may appear due to electromagnetic coupling within the system. The measurement of the pulse form (13) resulting from the combination of different effects during system operation is very helpful to detect and remove errors within the system. Using commercial power meters one can only measure the steady state power levels of the system output power so cannot cover dynamic behavior which is critical to find sources of some anomalies within the system. The invention is capable of performing measurement of pulse power and profiling dynamically as needed. Consequently, the invention is eliminating shortcoming of commercial power measurement.

The power measurement technique of the invention is not useful for only measuring power of optical laser pulses, mentioned technique is also can be used for power measurement in any band across the electromagnetic spectrum in case of providing suitable sub-units. For example, in the case of using mentioned method in the RF/microwave band, a RF oscillator instead of the laser source, a RF power amplifier instead of the optical power amplifier (2), RF switches instead of the modulators (3,8), a medium class RF power amplifier instead of the drivers (4, 7), a RF coupler and a receivers instead of the coupler (5) and optical receivers (9a,9b) can be used and the other elements of the system (6, 10.a, 10.b, 11.a, 11.b and 12) are kept thus, power measurement of the pulsed RF power can be carried out in high dynamic range and high speed.

What is claimed is:

1. A measurement apparatus, for determining power levels of pulsed signals in conduction and cut-off states with a high dynamic range and a high speed, comprising
    at least one pulsed power signal generator, wherein the at least one pulsed power signal generator generates pulses with a synchronous trigger signal, the at least one pulsed power signal generator comprises at least one continuous signal source, at least one power amplifier, a first modulator with a trigger signal interface,
    at least one power divider unit, wherein the at least one power divider unit is connected to an output of the first modulator and divides the pulsed signals from the first modulator to parts as a low power part and a high power part,
    at least one wideband receiver, wherein the at least one wideband receiver is connected with a low power output of the at least one power divider unit and measures a high power portion of a pulsed power signal,
    a first low pass filter, wherein the first low pass filter is connected with the at least one wideband receiver for a band limiting and an anti-aliasing,
    a first analog-digital converter for digitizing the pulsed signals taken from the first low pass filter,
    a second modulator, wherein the second modulator is connected to a high power output of the at least one power divider unit and prevents to be including the high power portion (conduction state power) of the pulsed signals in a power measurement by a way of entering into a cut-off mode when the first modulator is in a conduction mode and entering into the conduction mode when the first modulator is in the cut-off mode,
    at least one low noise receiver, wherein the at least one low noise receiver is connected with the second modulator and measures a low power portion ($P_{min}$) of the pulsed signals,
    a second low pass filter, wherein the second low pass filter is connected with the at least one low noise receiver for the band limiting and the anti-aliasing,
    a second analog-digital converter for digitizing the pulsed signals taken from the second low pass filter,
    at least one data processing and monitoring unit, wherein the at least one data processing and monitoring unit forms a pulse profile for processing and respectively combining the pulsed signals digitally from the first analog digital converter and the second analog digital converter and displays in a numerical and graphical form,
    a first driver, wherein the first driver amplifies pulses needed by the first modulator, and synthesizes an RF carrier when the first modulator is an Acousto Optic Modulator (AOM),
    a second driver, wherein the second driver generates pulses needed by the second modulator, and synthesizes the RF carrier when the second modulator is the AOM,
    at least one timing unit, wherein the at least one timing unit is connected with the first driver and the second driver for controlling the first modulator and the second modulator as making the second modulator entering into the cut-off state when the first modulator is in the conduction mode and making the second modulator entering into the conduction mode when the first modulator is in the cut-off mode, additionally adjust a delay between trigger signals to compensate signal propagation times along a signal path, and work synchronously with the first analog digital converter, the second analog digital converter and the at least one data processing and monitoring unit.

2. The measurement apparatus according to the claim 1, wherein using a narrow measurement window for increasing a resolution of a measuring leakage power instead of a single measurement namely integrating whole power after a pulse, a number (N) of the narrow measurement window or the resolution is determined as;

$$N = \frac{T-\tau}{\tau_m},$$

wherein, T is a pulse period, $\tau$ is a pulse width, and $\tau_m$ is a narrow measurement window duration.

3. The measurement apparatus according to the claim 2, when a power measuring for the $P_{min}$ with a power meter instead of a photodiode or the at least one wideband receiver or the at least one low noise receiver over multiple periods for the narrow measurement window, the power meter reading is an average power, a real value of the $P_{min}$ of a related window is calculated as;

$$P_{min} = P_{ave} \times \frac{T}{\tau_m}.$$

4. The measurement apparatus according to the claim 1, wherein a power division ratio about the at least one power divider unit is determined thereby taking in consideration a peak power of pulse and power limits of the at least one wideband receiver and the at least one low noise receiver.

5. The measurement apparatus according to the claim 1, wherein a power distribution at outputs of the at least one power divider unit is branched into two paths.

6. A measurement method for determining power levels signals in conduction and cut-off states with a high dynamic range and a high speed, wherein
- a pulsed power signal generator with a synchronous trigger signal to be measured comprises at least one continuous signal source, at least one power amplifier, at least one modulator with a trigger signal interface, and the measurement method comprises the following steps:
- branching the synchronous trigger signal to be measured into two paths, a division ratio is determined according to power limits of measuring at least one wideband receiver and at least one low noise receiver,
- preventing a high power portion of a signal effect on a measurement minimum power for blocking a conduction of the high power portion with a second modulator during a pulse width duration, wherein the pulse width duration is controlled by a timing unit synchronously with a first modulator,
- getting a higher resolution in a measurement of a leakage power by using a narrow measurement window, wherein the second modulator goes on state during the narrow measurement window then back to an off state,
- reducing a minimum measurable leakage power by carrying out a measurement on the narrow measurement window over multiple periods, wherein the second modulator goes on during a relevant time window then back to the off state,
- measuring the high power portion of the signal with the at least one wideband receiver,
- filtering output signals of the at least one wideband receiver with a first low pass filter,
- digitizing filtered signals with a first analog-digital converter,
- power measuring of the low power portion of the signal with the at least one low noise receiver,
- filtering output signals of the at least one low noise receiver with a second low pass filter,
- digitizing filtered signals with a second analog-digital converter,
- taking into digitized and filtered signals came from the first analog-digital converter and the second analog-digital converter, and obtained numerical $P_{max}$ and $P_{min}$ values and a graphical pulse profile displayed by a data processing and monitoring unit.

7. The measurement method according to the claim 6, wherein the measurement method is usable for applying all bands across an electromagnetic spectrum when equivalent sub-units are substituted.

* * * * *